United States Patent
Tashiro et al.

[19]

[11] Patent Number: 6,080,997
[45] Date of Patent: *Jun. 27, 2000

[54] ELECTROMAGNETIC-WAVE DETECTOR

[75] Inventors: Kazuaki Tashiro, Hadano; Noriyuki Kaifu, Hachioji; Shinichi Takeda, Atsugi; Isao Kobayashi, Atsugi; Tadao Endo, Atsugi; Toshio Kameshima, Sagamihara, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/708,300

[22] Filed: Sep. 4, 1996

[30] Foreign Application Priority Data

Sep. 4, 1995 [JP] Japan .................................. 7-226490
Jul. 29, 1996 [JP] Japan .................................. 8-198758

[51] Int. Cl.⁷ .......................... H01L 29/06; H01L 29/04
[52] U.S. Cl. ............................... 257/28; 257/30; 257/53; 257/54; 257/453; 257/458
[58] Field of Search .................................. 257/28, 30, 37, 257/52, 53, 54, 458, 463, 453

[56] References Cited

U.S. PATENT DOCUMENTS

| | | | |
|---|---|---|---|
| 4,358,782 | 11/1982 | Takasuka et al. | 257/54 |
| 4,472,728 | 9/1984 | Grant et al. | 257/430 |
| 4,665,412 | 5/1987 | Ohkawa et al. | 257/17 |
| 4,863,245 | 9/1989 | Roxlo | 350/356 |
| 4,904,859 | 2/1990 | Goossen et al. | 250/211 J |
| 5,424,565 | 6/1995 | Kemmer | 257/290 |
| 5,510,644 | 4/1996 | Harris et al. | 257/458 |
| 5,557,114 | 9/1996 | Leas et al. | 257/59 |
| 5,591,963 | 1/1997 | Takeda et al. | 250/214.1 |

*Primary Examiner*—Mahshid Saadat
*Assistant Examiner*—Allan R. Wilson
*Attorney, Agent, or Firm*—Fitzpatrick, Cella, Harper & Scinto

[57] ABSTRACT

An electromagnetic-wave detector having an electromagnetic-wave detection unit having the structure that M (M≧1) contiguous pairs of a metallic layer and an insulating layer are provided at the side of incidence of an electromagnetic-wave, such as X-rays.

23 Claims, 15 Drawing Sheets

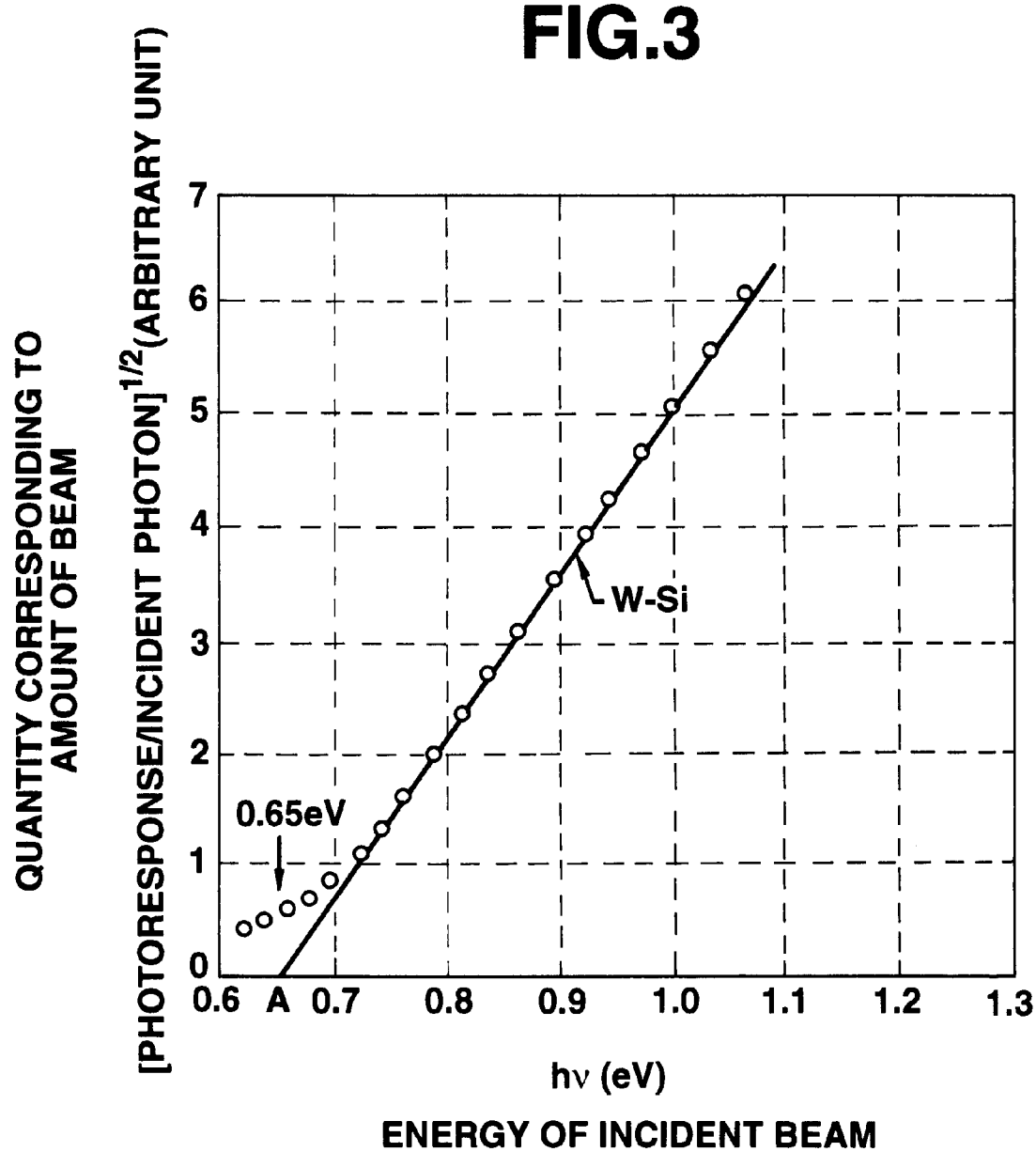

ELECTROMAGNETIC-WAVE DETECTOR

BACKGROUND OF THE INVENTION

1. Field of the Invention

This invention relates to an electromagnetic-wave detector, and more particularly, to an electromagnetic-wave detector sensitive to X-rays to be used for an X-ray apparatus for medical diagnosis, an X-ray transmission testing apparatus for metallic materials and the like, an X-ray defect detection apparatus, an X-ray baggage inspection apparatus used at an airport or the like, an X-ray diffraction apparatus, an X-ray analysis apparatus, an X-ray thickness measuring apparatus, an X-ray stress measuring apparatus or the like.

2. Description of the Related Art

Recently, various applicational apparatuses utilizing an electromagnetic wave, particularly, X-rays, are being used. For example, medical X-ray apparatuses (X-ray chest-imaging apparatuses, X-ray stomach-imaging apparatuses and the like), X-ray defect detecting apparatuses for metallic materials, X-ray baggage inspection apparatuses used at air-ports or the like, X-ray diffraction apparatuses, X-ray analysis apparatuses, and the like are widely used utliizing the characteristics of transmission, diffraction, absorption, scattering or the like of X-rays.

FIG. 1(a) illustrates the configuration of a conventional X-ray apparatus for medical use. In FIG. 1(a), there are shown an X-ray generating tube 901, an object 902 to be photographed, a phosphor 903 for converting X-rays into visible light, and an X-ray film 904. This is an apparatus used when photographing still pictures, such as an X-ray chest imaging apparatus or the like.

FIG. 1(b) illustrates the configuration of another X-ray apparatus for taking moving pictures, such as an X-ray stomach-imaging apparatus or the like. In FIG. 1(b), there are shown an X-ray generating tube 901, an object 902 to be photographed, a phosphor 903 for converting X-rays into visible light, an optical system 905 for focusing visible light onto a sensor, and a two-dimensional photosensor 906 using an image pickup device, such as a CCD (charge-coupled device) or the like. A method of taking images by installing a television camera at the position of the two-dimensional photosensor has been practically utilized. In order to detect X-rays in the above-described apparatuses, an X-ray image is obtained by exposing a silver-halide film to X-rays, or by exposing a structure having phosphor layers in contact with both surfaces of a silver-halide film to X-rays in order to increase the sensibility due to fluorescence emitted from the phosphor layers exposed to the X-rays. In another approach, An X-ray image is obtained by converting X-rays into visible light by projecting the X-rays onto a phosphor, and focusing the visible light onto a photosensor, such as a CCD, or onto a television camera using an optical system.

The above-described method of using a silver-halide film has the advantages that a high-definition image is obtained, and that since portions irradiated by X-rays are directly photographed by the film with unit magnification, it is only necessary to set a film cassette at a side of the object to be photographed opposite to the X-ray source, and therefore the structure of the system is simplified. In this method, however, an X-ray image cannot be obtained in real time, and moving pictures cannot be obtained. Furthermore, it is difficult to utilize the obtained image by performing image processing, and therefore the range of application is limited.

On the other hand, the method of using a photosensor has the advantages that an image can be obtained in real time, moving images can also be obtained, and various kinds of information can be obtained by performing image processing. However, in the conventional method of using a photosensor or a television camera, in order to obtain the image of a large object at a time, a particular reduction optical system is required, thereby increasing the size of the entire system and the production cost. As a result, only large hospitals can use such diagnostic inspection apparatuses. Furthermore, since X-rays are converted into visible light using a phosphor, the efficiency of utilization of X-rays is inferior, and the obtained image is dark because the illuminance of the visible light is low. It is desired to increase the efficiency in locations where only weak X-rays can be used, such as actual medical fields.

Some methods for detecting X-rays without using a phosphor have been proposed. For example, at the 1985 Spring Meeting of the Japan Society of Applied Physics, an attempt to directly detect X-rays by forming a p-i-n-type sensor or a photoconductive sensor using hydrogenated amorphous silicon has been announced. However, since hydrogenated amorphous silicon has a low sensitivity to X-rays, it is difficult to practically use this material by itself. In practice, the sensitivity is increased substantially by two or three digits (orders of magnitude) by providing a phosphor on the sensor (see Extended Abstracts p. 29a-U-7).

Y. Naruse et al. have made an attempt to absorb X-rays in a metal layer, guide photoelectrons generated in the metal layer to a hydrogenated amorphous silicon layer, and detect the photoelectrons (Int. Conf. on Solid State Sensor & Actuators, Tokyo, p. 262, 1987). This attempt is excellent in increasing the sensitivity for X-rays utilizing the photoelectric effect. However, as will be described later, the dark current is large in this structure, thereby providing a big problem when high sensitivity is required (for example, in medical apparatuses where the dose rate of X-rays is small).

As described above, various attempts have been made in order to provide higher sensitivity. However, the above-described problems have not yet been completely solved. Since the above-described problems are common not only for medical apparatuses but also for all electromagnetic-wave detection apparatuses represented by X-ray apparatuses, it has been desired to completely solve these problems.

SUMMARY OF THE INVENTION

It is an object of the present invention to provide an electromagnetic-wave detector which solve the above-described problems.

It is another object of the present invention to provide an electromagnetic-wave detector which can be used for obtaining real-time moving images.

It is still another object of the present invention to provide an electromagnetic-wave detector which can utilize detected electromagnetic-wave information by performing image processing of the information.

It is still another object of the present invention to provide an electromagnetic-wave detector which can be used in place of a conventional film cassette, without using a particular reduction optical system i.e., where the light receiving face has the same dimensions as the corresponding optical film.

It is still another object of the present invention to provide a device for detecting an electromagnetic wave, such as X-rays, capable of having high functions with a low cost.

It is still another object of the present invention to provide a device for detecting an electromagnetic wave, such as X-rays, according to an entirely new method for replacing a conventional sensor, such as a silver-halide film, a CCD or the like.

According to one aspect, the present invention which achieves these objectives relates to an electromagnetic-wave detector comprising an electromagnetic-wave detection unit comprising M (M≧1) consecutive pairs of a metallic layer and an insulating layer at the side of incidence of an electromagnetic wave, and a semiconductor layer at the side of the insulating layer.

In one embodiment, the metallic layer comprises a material including atoms of at least one element selected from the group of tungsten (W), gold (Au), tantalum (Ta) and lead (Pb).

In another embodiment, the insulating layer comprises an amorphous material comprising silicon as a host material including atoms of at least one element selected from the group of nitrogen, carbon and oxygen.

In still another embodiment, the amorphous material comprises at least one selected from the group of a hydrogenated and/or halogenated amorphous silicon nitride film, a hydrogenated and/or halogenated amorphous silicon carbide film, and a hydrogenated and/or halogenated amorphous silicon oxide film.

In still another embodiment, the insulating layer comprises a silicon oxide film or a metal oxide film.

In still another embodiment, the semiconductor layer comprises a noncrystalline semiconductor layer.

In still another embodiment, the noncrystalline semiconductor layer comprises amorphous silicon.

In still another embodiment, the semiconductor layer comprises an i-type semiconductor layer.

In still another embodiment, the semiconductor layer contacts an n$^+$-type layer at a side opposite to the insulating layer.

In still another embodiment, the semiconductor layer is made in ohmic contact with an electrode at a side opposite to the insulating layer.

In still another embodiment, the semiconductor layer comprises an i-type-layer region and an n-type-layer region.

In still another embodiment, the semiconductor layer comprises a p-type-layer region, an i-type-layer region and an n-type-layer region provided sequentially from the insulating layer.

In still another embodiment, the number M of pairs of the metallic layer and the insulating layer is equal to or greater than 2, and the metallic layers and the insulating layers of the respective pairs are made of the same materials, respectively.

In still another embodiment, the detector includes a pair of electrodes in ohmic contact with the semiconductor layer.

In still another embodiment, the detector includes at least one pair of electrodes in ohmic contact with the semiconductor layer at the side where the pairs of the metallic layer and the insulating layer are provided.

In still another embodiment, the detector includes at least one pair of electrodes in ohmic contact with the semiconductor layer at a side opposite to the side where the pairs of the metallic layer and the insulating layer are provided.

In still another embodiment, the noncrystalline semiconductor includes silicon atoms.

In still another embodiment, the amorphous silicon comprises hydrogenated amorphous silicon.

In still another embodiment, the insulating layer has a thickness of at least 500 Å.

In still another embodiment, pixel regions, each comprising a detection unit and a driving unit, are arranged one-dimensionally or two-dimensionally on the same substrate.

In still another embodiment, the electromagnetic wave includes X-rays.

In still another embodiment, the metallic layer has the same material as a target material of an X-ray generating tube for generating X-rays.

According to the present invention which achieves the foregoing objectives, it is possible to provide a low-cost compact system in which moving images that cannot be obtained by using a silver-halide film can be obtained in real time, and in which the obtained images can be further utilized by being subjected to image processing. It is also possible to provide low-cost devices for detecting an electromagnetic wave, such as X-rays, having a higher sensitivity than conventional devices. The obtained devices can be utilized for various kinds of X-ray detection apparatuses.

The foregoing and other objects, advantages and features of the present invention will become more apparent from the following detailed description of the preferred embodiments taken in conjunction with the accompanying drawings.

BRIEF DESCRIPTION OF THE PREFERRED EMBODIMENTS

FIGS. 1(a) and 1(b) are schematic diagrams illustrating the basic configurations of conventional X-ray imaging apparatuses;

FIGS. 2(a) and 2(b) are a schematic cross-sectional view and a schematic energy-band diagram, respectively, of an electromagnetic-wave detector;

FIG. 3 is a graph illustrating a characteristic of the photoelectric effect;

FIGS. 4(a) and 4(b) are a schematic cross-sectional view and a schematic energy-band diagram, respectively, of another electromagnetic-wave detector;

FIG. 5 is a graph illustrating characteristics of a first embodiment and a third embodiment of the present invention;

FIGS. 6(a) through 8(a) and 6(b) through 8(b) are schematic cross-sectional views and schematic energy-band diagrams, respectively, of still another electromagnetic-wave detectors;

FIGS. 9(a) and 9(b) are a schematic plan view and a schematic cross-sectional view of one detection unit (pixel region) of still another electromagnetic-wave detector;

Figure 13A:
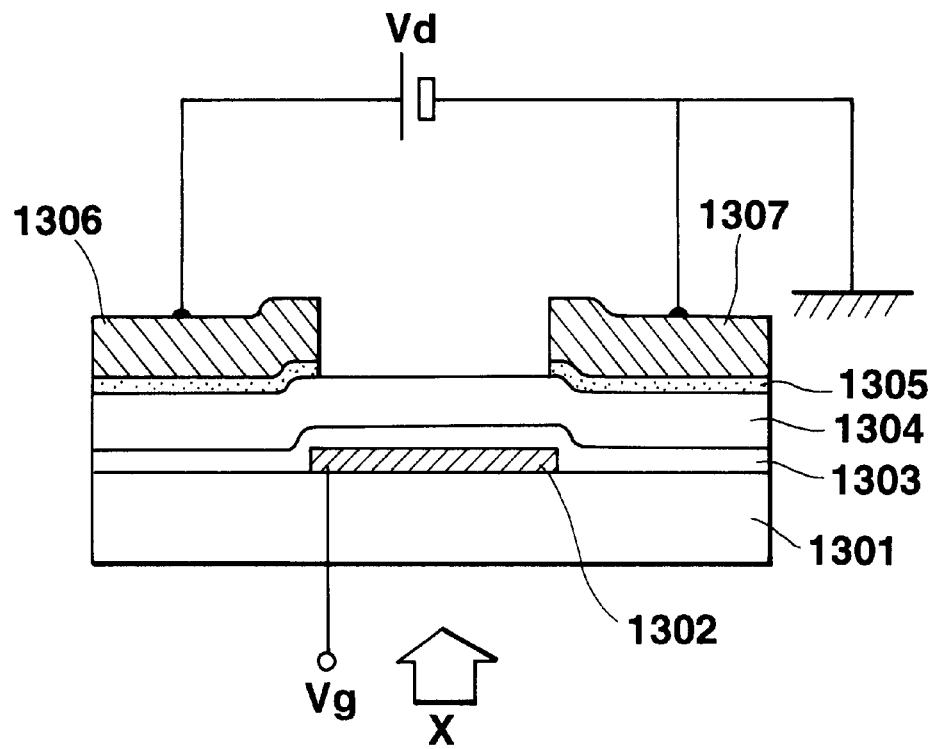
Figure 13B:
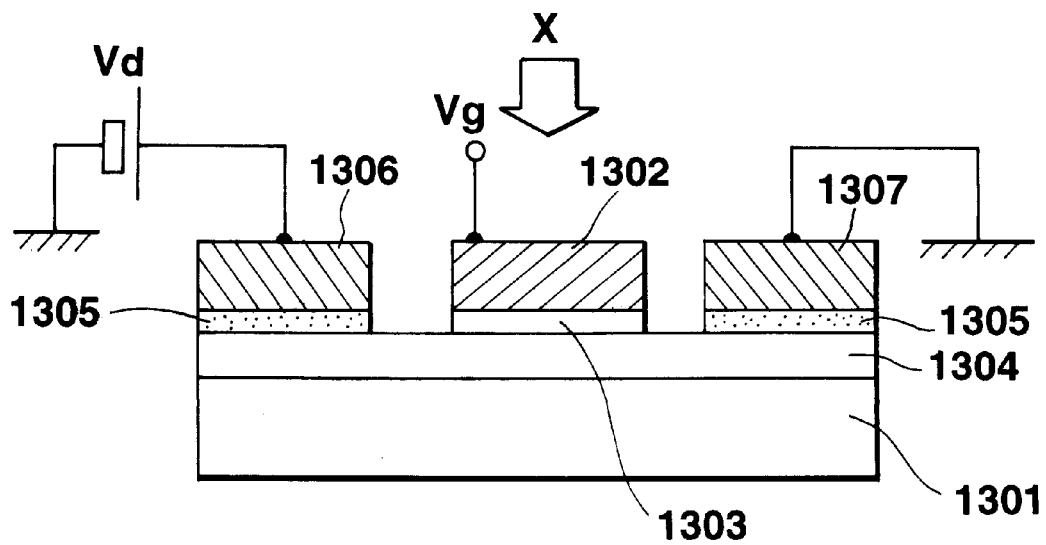
Figure 14:
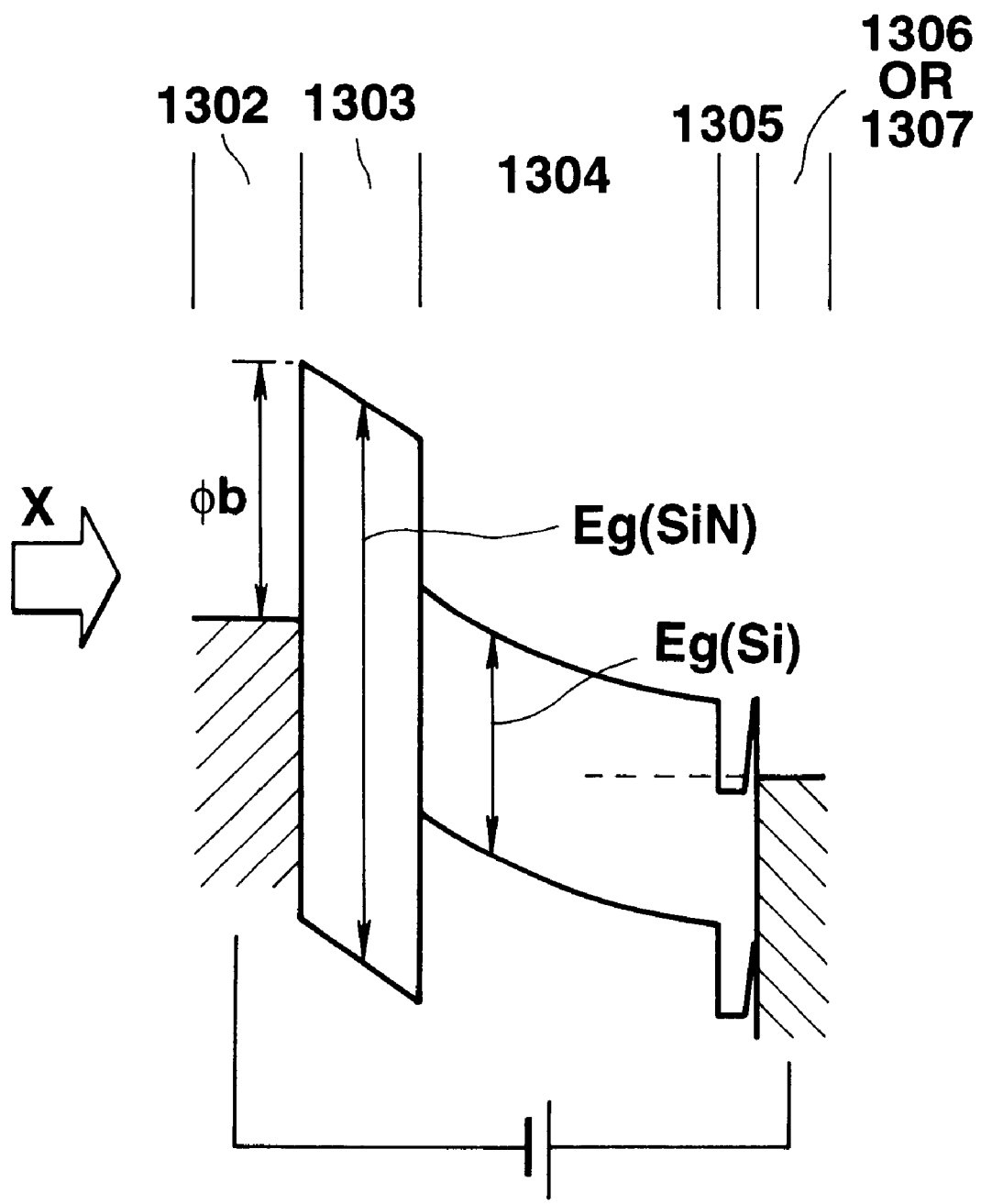
Figure 15:
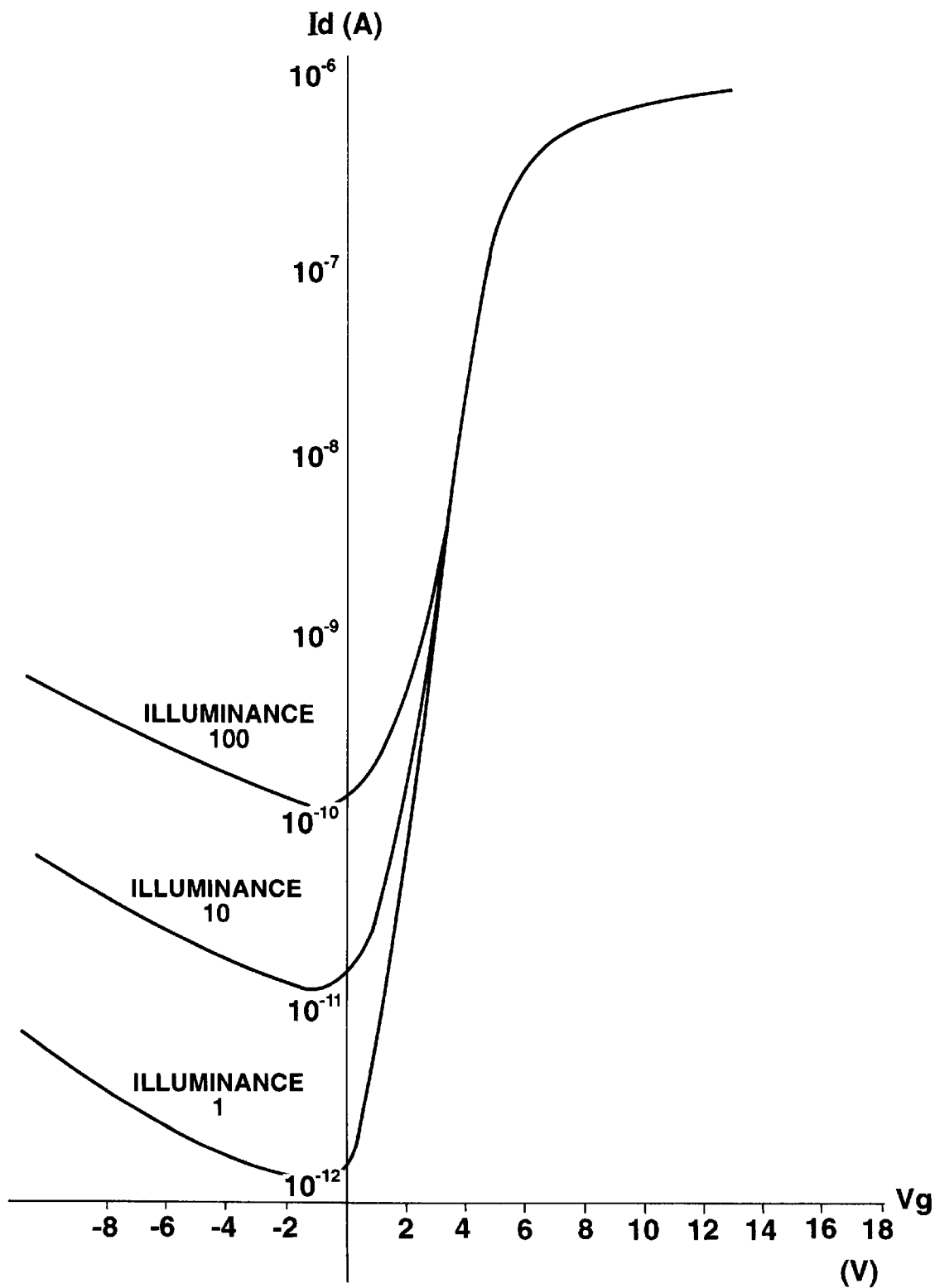
Figure 16:
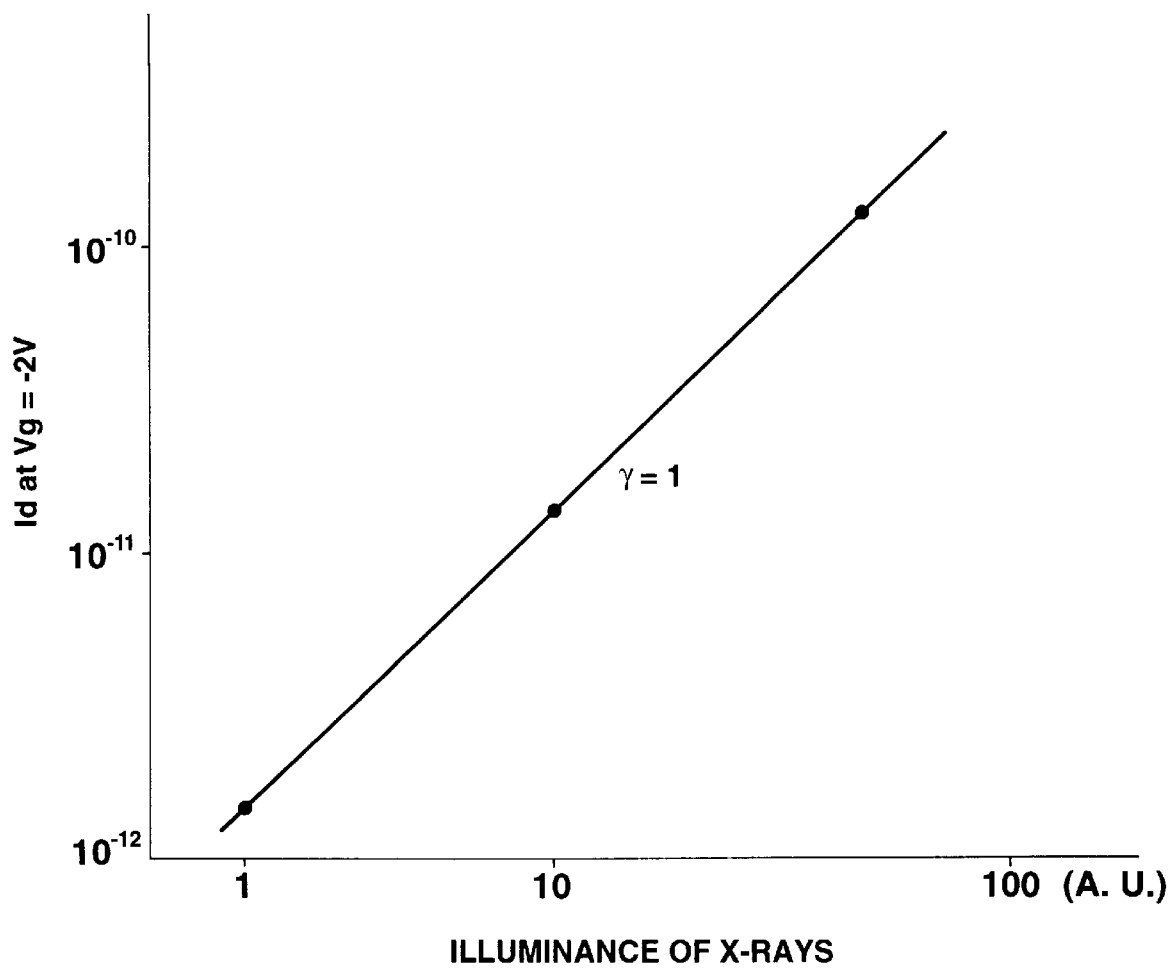

FIGS. 13(a) and 13(b) are schematic cross-sectional views illustrating still another electromagnetic-wave detectors;

FIG. 14 is a schematic energy-band diagram of the electromagnetic-wave detector shown in FIG. 13(a) or 13(b); and FIGS. 15 and 16 are diagrams illustrating characteristics of the electromagnetic-wave detector shown in FIG. 13(a) or 13(b).

DETAILED DESCRIPTION OF THE PREFERRED EMBODIMENTS

First, the principle of a device for detecting an electromagnetic wave, such as X-rays, according to the present invention will be briefly described.

Figure 1A:
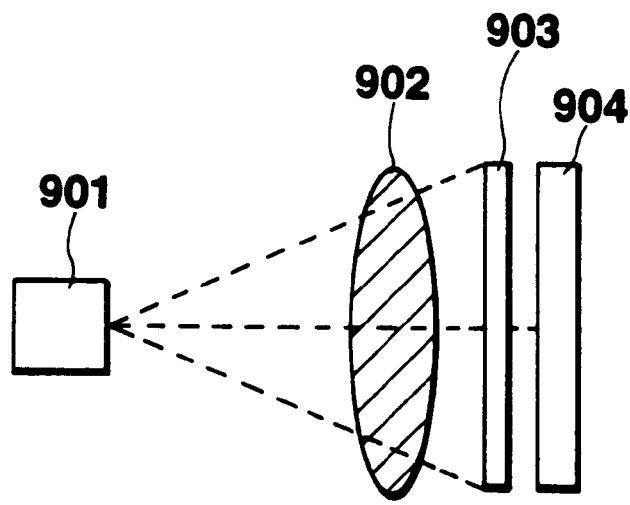
Figure 1B:
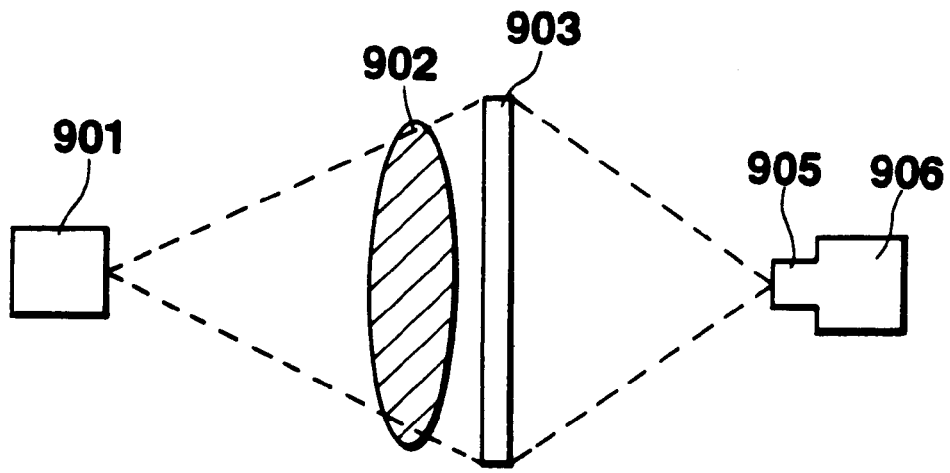
Figure 2A:
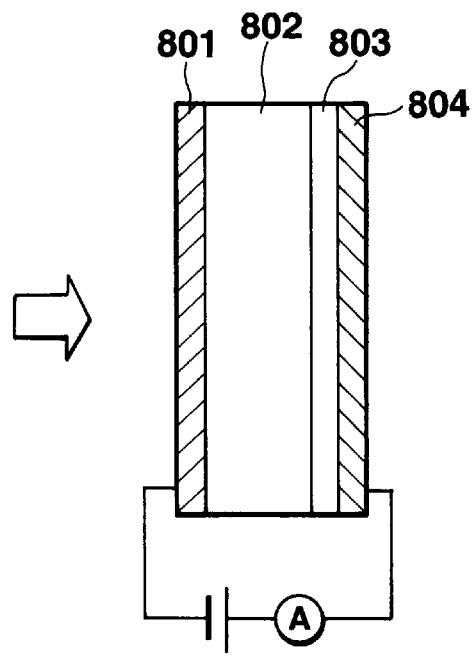

FIG. 2(a) is a schematic cross-sectional view of such a detector. In FIG. 2(a), there are shown a metallic layer 801, a semiconductor layer 802, such as an i-type hydrogenated amorphous silicon layer, an ohmic-contact layer 803, and a metallic layer 804. These layers are sequentially laminated. An electromagnetic wave is incident from the direction indicated by the arrow, i.e., from the side of the metallic layer 801 which contacts the semiconductor layer 802.

Figure 2B:
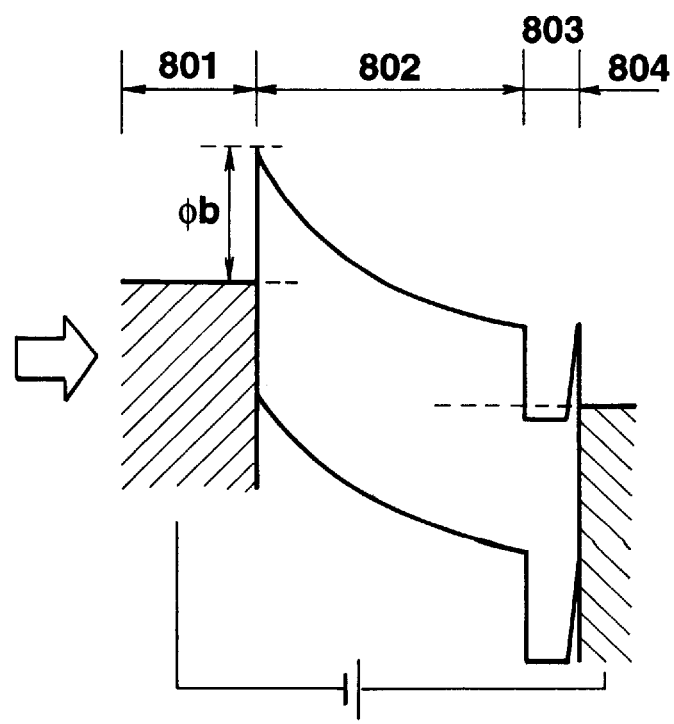

FIG. 2(b) is a schematic energy-band diagram of the detector having the configuration shown in FIG. 2(a). In FIG. 2(b), there are also shown the metallic layer 801, the semiconductor layer 802, an n+-type semiconductor layer, serving as the ohmic contact layer 803, and an electrode layer 804, serving as the metallic layer 804.

First, a description will be provided of the principle of detection of X-rays of the X-ray detector of the present invention. In general, the metallic layer 801 and the semiconductor layer 802 have different work functions. When these layers are brought into contact with each other, a difference occurs between the work functions of the respective layers. This is the so-called barrier height $\phi_b$. Consider a case in which light having energy of $\epsilon = h\nu > \phi_b$ is incident upon the metallic layer 801. The light incident upon the metallic layer 801 excites electrons within the conduction band of the metallic layer 801. When the energy of the light is sufficiently large, the light excites not only electrons in the conduction band but also inner-shell electrons. These electrons are emitted from the metallic layer 801 by receiving the energy of $\epsilon = h\nu$. This is the photoelectric effect. In this case, since the electrons have energy equal to or greater than the barrier height $\phi_b$, the emitted electrons clear the barrier and are injected into the semiconductor layer 802. The injected electrons cause a current which can be detected by an external measuring apparatus.

FIG. 3 illustrates a characteristic of the photoelectric effect when tungsten and silicon are used for the metallic layer 801 and the semiconductor layer 802, respectively. The abscissa represents the energy of incident light. The ordinate represents a quantity corresponding to the value of current. In FIG. 3, measurement is performed by making the number of incident photons constant, and changing the wavelength, i.e., the energy of the light. When the energy of the incident light exceeds $\phi_b$, a current starts to flow based on the above-described principle. Hence, in FIG. 3, a point A corresponds to $\phi_b$, which equals 0.65 eV. In actual X-ray detecting apparatuses, measurement is performed, for example, by maintaining the intensity constant while changing the wavelength of X-rays, or by changing the intensity while maintaining the wavelength of X-rays constant.

A similar effect is obtained if tungsten and a hydrogenated amorphous silicon layer are used for the metalic layer 801 and the semiconductor layer 802, respectively. However, since a large number of defects are present within the hydrogenated amorphous silicon layer, a tunnel leak current via these defects tends to flow at the interface between the metallic layer 801 and the hydrogenated amorphous silicon layer 802.

Figure 4A:
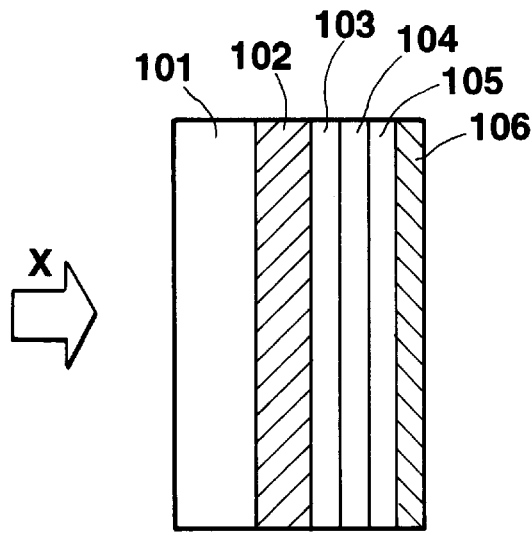
Figure 4B:
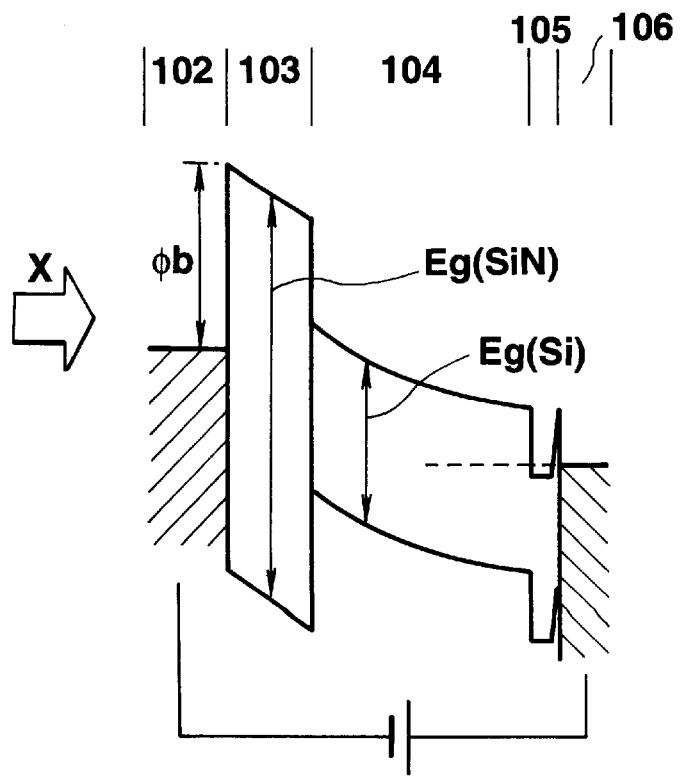

In order to solve such problem, the inventors of the present invention have considered an energy-band structure shown in FIG. 4(b). In FIG. 4(b), there are shown a metallic layer 102, an insulating layer 103, a semiconductor layer 104, an n+-type semiconductor layer 105, and an electrode layer 106. A MIS (metal-insulator-semiconductor) structure is obtained by providing a layer having a sufficiently large energy gap, such as a hydrogenated amorphous silicon nitride layer, between the metallic layer 102 and the semiconductor layer 104. Since the barrier height $\phi_b$ between the metallic layer 102 and the hydrogenated amorphous silicon nitride layer 103 has a sufficiently large value of about 2 to 3 eV, the tunnel leak current can be suppressed to a very small value if the thickness of the barrier layer is appropriately selected. When using the device for detecting a high-energy electromagnetic wave, such as X-rays, the barrier height is desirably as large as possible. Even if light having a wavelength equal to or longer than that of ultraviolet light is incident upon this MIS structure, little current due to the photoelectric effect flows because the energy of the light is lower than the barrier height. That is, this device is substantialy insensitive to light having energy equal to or less than that of ultraviolet light. However, since the energy of X-rays is very high, electrons excited by X-rays can have sufficient energy to clear the barrier height. Such electrons enter the semiconductor layer, and can be detected as a photocurrent. That is, the device having the above-described structure is sensitive to X-rays. By applying this idea, the inventors were able to provide an X-ray detector which directly detects X-rays with an excellent sensitivity and a large S/N ratio without requiring a phosphor.

Embodiments of the present invention will now be described with reference to the drawings.

First Embodiment

FIG. 4(a) illustrates an electromagnetic-wave detector according to a first preferred embodiment of the present invention. In the first embodiment, a single-unit X-ray detector is shown. A description will now be provided of the structure and the manufacturing method of the device having a schematic cross section as shown in FIG. 4(a).

First, a tungsten film 1 μm thick is formed on a cleaned glass substrate 101 by sputtering as the metallic layer 102. Since the metallic layer 102 serves as a layer for absorbing X-rays (in FIGS. 4(a) and 4(b), X represents incident X-rays), an element having a large atomic weight having a large X-ray absorption coefficient, such as tungsten (W), gold (Au), tantalum (Ta), lead (Pb) or the like, is selected as the material for the metallic layer 102. In the first embodiment, tungsten is used. Then, a hydrogenated amorphous silicon nitride film 500 Å thick is deposited as the insulating layer 103 by plasma CVD (chemical vapor deposition) using $SiH_4$, $NH_3$ and $H_2$. Since hydrogenated amorphous silicon nitride has a band gap close to 5 eV, it can form a sufficient barrier height with a metal. Any other insulating material may also be used, provided that a sufficiently large barrier height can be formed.

For example, a hydrogenated amorphous silicon carbide film, a hydrogenated amorphous silicon oxide film, a silicon oxide film, or a metal oxide film, such as an aluminum oxide film or the like, may be used instead of the hydrogenated amorphous silicon nitride film. A halogenated (preferably fluorinated) film using halogen atoms, such as fluorine atoms, may also be used instead of the hydrogenated film. Hydrogenation or halogenation may not be performed provided that a film having desired characteristics can be obtained. As for nitrogen, carbon and oxygen, only atoms of one element selected from these elements may be contained, or atoms of at least two elements selected from these elements may be contained. The same holds for other preferred embodiments (to be described later).

Then, a noncrystalline semiconductor layer, such as an i-type (or substantially i-type) hydrogenated amorphous silicon layer 1000 Å thick is deposited as the semiconductor layer 104 by plasma CVD using, for example, $SiH_4$ and $H_2$ as source gases. Then, an $n^+$-type hydrogenated amorphous silicon layer 500 Å thick is deposited as the $n^+$-type semiconductor layer 105, for providing ohmic contact between the semiconductor layer 104 and the electrode layer 106, by plasma CVD using, for example, $SiH_4$, $PH_3$ and $H_2$ as source materials. If a series of hydrogenated amorphous silicontype materials are used, the successive layers can be easily formed using the same apparatus. Plasma CVD is very advantageous when manufacturing large-area X-ray detectors with a low cost, because a large-area uniform film can be formed. Finally, an aluminum layer 1 μm thick is deposited by sputtering as the electrode layer 106.

In the present embodiment, the tungsten metallic layer 102, serving as an X-ray absorbing layer, is first formed. However, since it is only necessary that the metallic layer, the insulating layer and the semiconductor layer contact each other in this sequence, a manufacturing process reverse to the above-described process, in which the aluminum metallic layer is first deposited and finally the tungsten metallic layer is deposited, is also possible.

FIG. 4(b) illustrates the energy-band structure of the detector of the present embodiment formed in the above-described manner. In FIG. 4(b), $\phi_b$ represents the barrier height between the metallic layer 102 and the hydrogenated amorphous silicon nitride layer 103. The value of $\phi_b$ equals 2.5 eV under the conditions of the present embodiment. In FIG. 4(b), Eg (SiN) represents the band gap of the hydrogenated amorphous silicon nitride film, and X represents incident X-rays. In order to evaluate the characteristics of this single-unit X-ray detector, a Coolidge tube having a tungsten target was used as the X-ray generating tube. The tube voltage was 140 kV, and the dose rate of X-ray irradiation was changed by changing the tube current. Continuous X-rays and the characteristic X-rays of tungsten were used as X-rays. The same material as that used for the metallic layer 102 of the X-ray detector was used as the target of the X-ray tube in order to improve the absorption efficiency of the characteristic X-rays of tungsten and the emission efficiency of Auger electrons via the Auger process by excited electrons. Since photoelectrons due to the simple photoelectric effect and photoelectrons due to the photoelectric effect including the Auger process can be utilized, improvement in the sensitive can be expected. By making the tube voltage constant, the shortest wavelength of the continuous X-rays is constant. When detecting X-rays, A bias voltage was applied from the outside so that the tungsten side is negative, the aluminum side is positive, and the intensity of the electric field within the i-type amorphous silicon layer has an appropriate value. The dose rate of X-ray irradiation on the surface of the X-ray detector was measured in advance by an X-ray irradiation dosimeter. The tunnel leak current in this structure could be suppressed to a very low level of about $10^{-13}$ A. Thus, an X-ray detector capable of directly detecting X-rays with a high sensitivity without requiring a phosphor could be manufactured.

Figure 5:
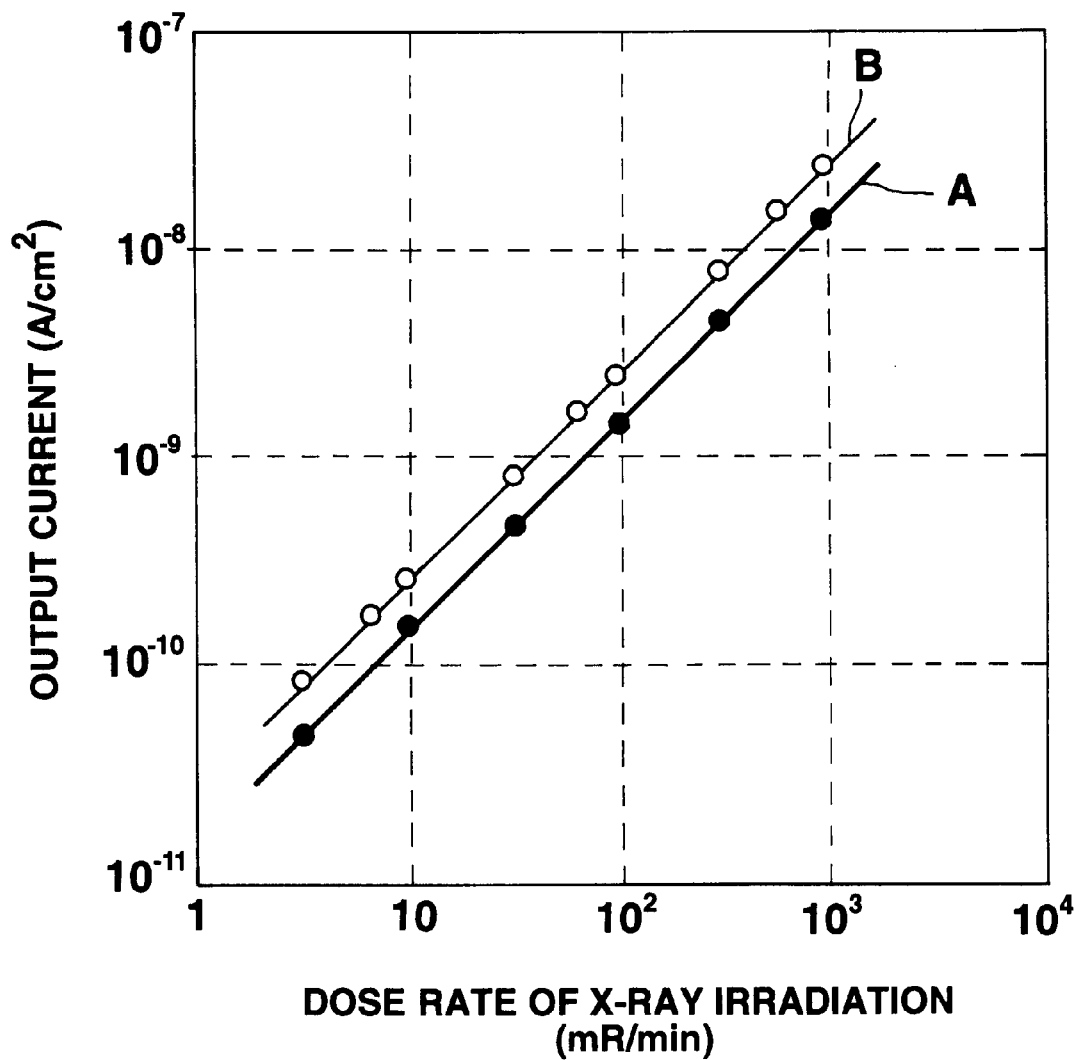

FIG. 5 illustrates an X-ray detection characteristic indicated by A in the present embodiment. In FIG. 5, the abscissa represents the dose rate of X-ray irradiation, and the ordinate represents the output current per unit area. As is apparent from FIG. 5, the relationship between the dose rate of X-ray irradiation and the output current shows an excellent linearity over a range of about 3 to 4 digits.

Second Embodiment

As the metallic layer is thicker, the absorption ratio of X-rays increases. However, when the metallic layer is too thick, a distance for a carrier generated within the metalic layer due to the photoelectric effect of X-rays to reach the semiconductor layer increases, and therefore the ratio of carrier recombination before reaching the semiconductor layer increases. As a result, the efficiency of injection of photoelectrons into the semiconductor layer decreases. Hence, an optimum value is present for the thickness of the metallic layer. By designing the metallic layer with an optimum thickness and superposing a plurality of such metallic layers, it is possible to further improve the efficiency of utilization of X-rays as well as the efficiency of injection of carriers into the semiconductor layer.

Figure 6A:
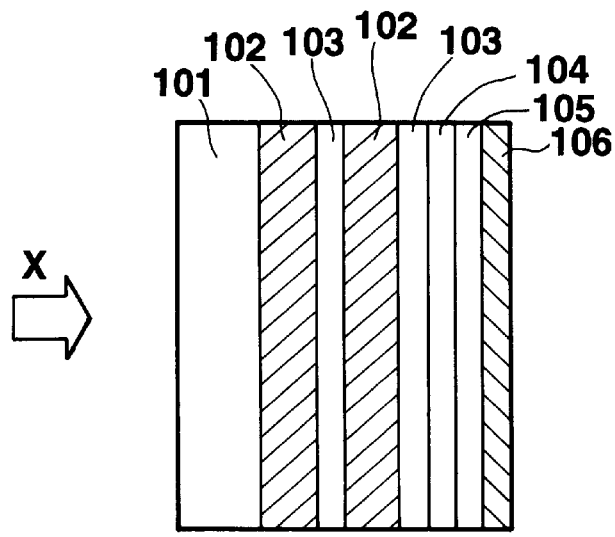
Figure 6B:
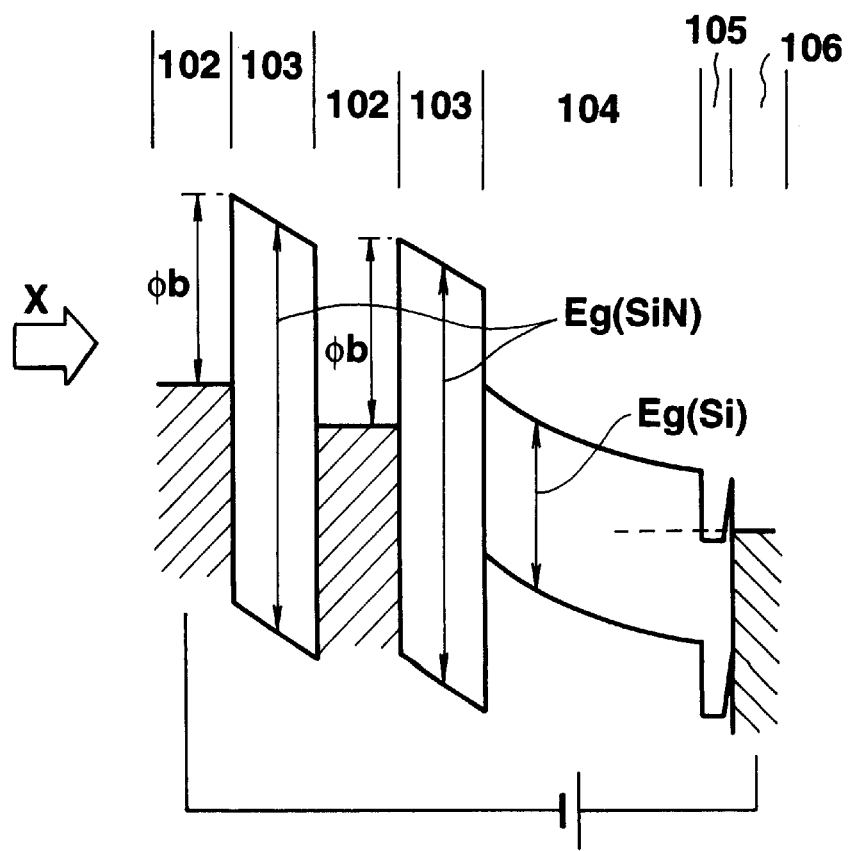

In the first embodiment, a description has been provided of the case of the number of pairs of the metallic layer and the insulating layer M=1. In a second embodiment of the present invention, however, the case of M=2 will be described. The number M may, of course, be equal to or greater than 2 (M>2). FIG. 6(a) illustrates the case of M=2, i.e., when two pairs of the metallic layer 102 and the insulating layer 103 are laminated. Other portions are the same as those shown in FIG. 4(a) representing the first embodiment. FIG. 6(b) illustrates the energy-band structure corresponding to this structure.

By laminating two pairs of the metallic layer 102 and the insulating layer 103, and by absorbing X-rays incident upon the first metallic layer and transmitted therethrough in the second metallic layer, photoelectrons are emitted based on the above-described principle. It is thereby possible to improve the efficiency of utilization of X-rays and therefore to increase the sensitivity of the X-ray detector. The optimum number of laminated pairs is determined as a design item in accordance with the intensity of incident X-rays, the efficiency of injection of photoelectrons into the semiconductor layer, and the like. In this case, also, the device is designed so that a desired amount of carriers (electrons) generated by incident X-rays are injected into the semiconductor layer by passing through the insulating layer.

Although, in FIG. 6(b), the same materials are used for the metallic layer 102 and the insulating layer 103 of the respective pairs, respectively, the materials for the metallic layer and the insulating layer may be changed for each pair in order to optimize the barrier height $\phi_b$ between the metallic layer and the insulating layer, and the band gap Eg of the insulating layer for each pair.

In the present embodiment, for the purpose of simplification, a single-unit detector is formed and evaluated. However, as will be described later, the detector may be divided into a plurality of pixel regions, or may be processed in various forms.

Third Embodiment

Figure 7A:
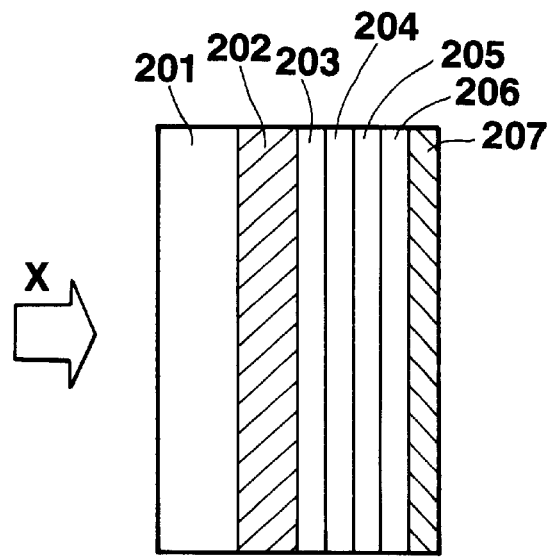

FIG. 7(a) is a schematic cross-sectional view of a detector according to a third embodiment of the present invention. In the third embodiment, an internal-field-type single unit X-ray detector having a p-i-n structure is provided. A description will now be provided of the structure and the manufacturing method of the detector shown in FIG. 7(a).

First, a tungsten film 1 μm thick is formed on a cleaned glass substrate 201 by sputtering as a metallic layer 202. Since the metallic layer 202 serves as a layer for absorbing X-rays, an element having a large atomic weight having a large X-ray absorption coefficient, such as tungsten (W), gold (Au), tantalum (Ta), lead (Pb) or the like, is selected as the material for the metallic layer 202. In the third embodiment, tungsten is used. Then, a hydrogenated amorphous silicon nitride film 500 Å thick is deposited as an insulating layer 203 by plasma CVD using $SiH_4$, $NH_3$ and $H_2$ as source gases. Since hydrogenated amorphous silicon nitride has a band gap close to 5 eV, it can form a sufficient barrier height with a metal. Any other insulating material may also be used, provided that a sufficiently large barrier height can be formed.

Then, a p$^+$-type hydrogenated amorphous silicon layer 204 200 Å thick is deposited by plasma CVD using SiH$_4$, B$_2$H$_6$ and H$_2$. This p$^+$-type layer is a feature of the third embodiment. In contrast to the first embodiment, the p$^+$-type layer and an n$^+$-type layer (to be described later) can form an internal field within an i-type semiconductor layer (to be described later). This internal field can efficiently move carriers to an electrode (to be described later) to further improve sensitivity.

Then, an i-type hydrogenated amorphous silicon layer 1000 Å thick is deposited as an i-type semiconductor layer 205 by plasma CVD using SiH$_4$ and H$_2$ as source gases. Then, an n$^+$-type hydrogenated amorphous silicon layer 500 Å thick is deposited as an n$^+$-type semiconductor layer 206 by plasma CVD using SiH$_4$, PH$_3$ and H$_2$ as source gases. If a series of hydrogenated amorphous silicon-type materials are used, the successive layers can be easily formed using the same apparatus. Plasma CVD is very advantageous when manufacturing large-area X-ray detectors with a low cost, because a large-area uniform film can be formed. Finally, an aluminum layer 1 μm thick is deposited by sputtering as an electrode layer 207.

In the present embodiment, the tungsten metallic layer 102, serving as an X-ray absorbing layer, is first formed. However, since it is only necessary that the metallic layer, the insulating layer and the semiconductor layer contact each other in this sequence, a manufacturing process reverse to the above-described process, in which the aluminum metallic layer is first deposited and finally the tungsten metallic layer is deposited, is also possible.

Figure 7B:
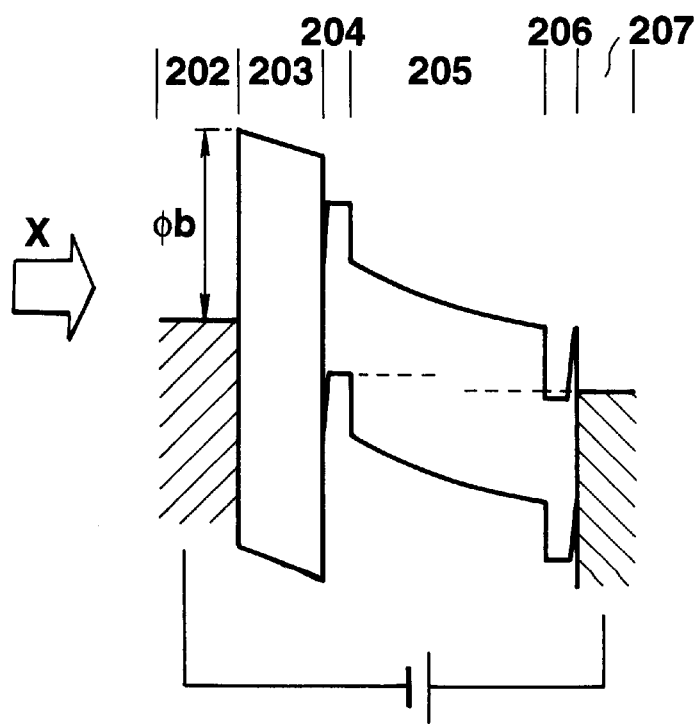

FIG. 7(b) illustrates the energy-band structure of the detector of the present embodiment formed in the above-described manner. In FIG. 7(b), $\phi_b$ represents the barrier height between the metallic layer and the hydrogenated amorphous silicon nitride film. The value of $\phi_b$ equals 2.5 eV under the conditions of the present embodiment. In FIG. 4(b), X represents incident X-rays. In order to evaluate the characteristics of this single-unit X-ray detector, a Coolidge tube having a tungsten target was used as the X-ray generating tube also in this embodiment. The tube voltage was 140 kV, and the dose rate of X-ray irradiation was changed by changing the tube current. Continuous X-rays and the characteristic X-rays of tungsten were used as X-rays. The same material as that used for the metallic layer 202 of the X-ray detector was used as the target of the X-ray tube in order to improve the absorption efficiency of tungsten and the emission efficiency of Auger electrons via the Auger process by excited electrons. Since photoelectrons due to the simple photoelectric effect and photoelectrons due to the photoelectric effect including the Auger process can be utilized, improvement in the sensitive can be expected. By making the tube voltage constant, the shortest wavelength of the continuous X-rays is constant. When detecting X-rays, A bias voltage was applied from the outside so that the tungsten side is negative, the aluminum side is positive, and the intensity of the electric field within the i-type amorphous silicon layer has an appropriate value. The dose rate of X-ray irradiation on the surface of the X-ray detector was measured in advance by an X-ray irradiation dosimeter. The tunnel leak current in this structure could be suppressed to a very low level of about 10$^{-13}$ A. Furthermore, in this structure, since an internal electric field is formed within the semiconductor, it is possible to suppress recombination of carriers in this depletion region to a low level, and therefore to increase the sensitivity of the detector. Thus, an X-ray detector capable of directly detecting X-rays with a high sensitivity without requiring a phosphor could be manufactured.

FIG. 5 illustrates an X-ray detection characteristic indicated by B in the present embodiment. In FIG. 5, the abscissa represents the dose rate of X-ray irradiation, and the ordinate represents the output current per unit area. As is apparent from FIG. 5, the relationship between the dose rate of X-ray irradiation and the output current shows an excellent linearity over a range of about 3 to 4 digits. The sensitivity is higher than that of the first embodiment.

Fourth Embodiment

Figure 8A:
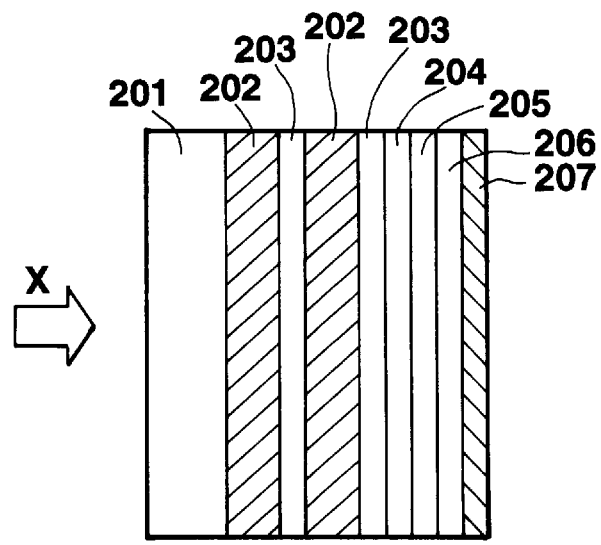
Figure 8B:
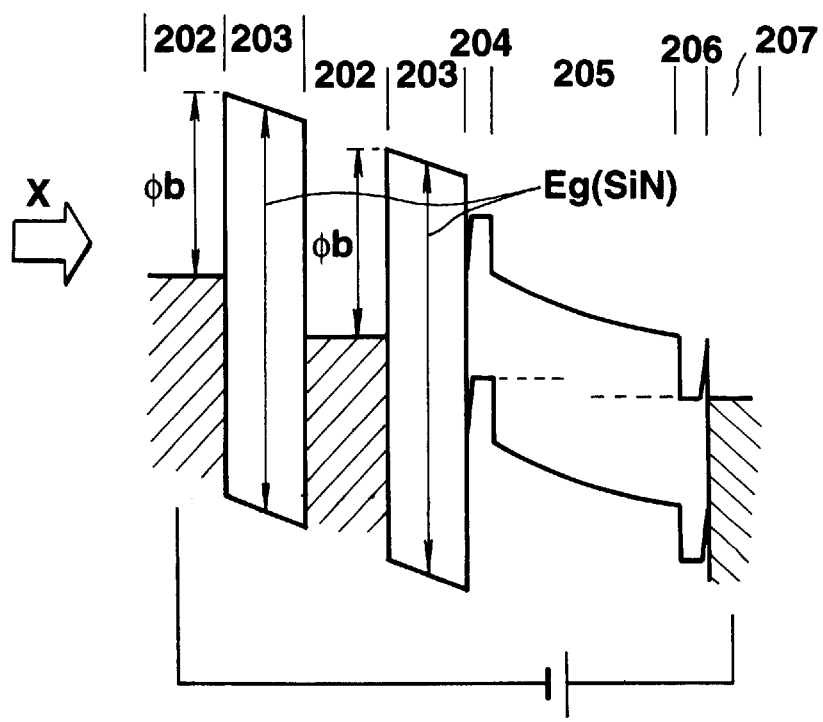

In the third embodiment, a description has been provided of the case of the number of pairs of the metallic layer and the insulating layer M=1. In a fourth embodiment of the present invention, however, the case of M≧2 will be described. FIG. 8(a) is a schematic cross-sectional view of a detector in the case of M=2, i.e., when two pairs of the metallic layer 202 and the insulating layer 203 are laminated. Other portions are the same as those shown in FIG. 7(a). FIG. 8(b) illustrates the energy-band structure corresponding to this structure.

By laminating two pairs of the metallic layer 202 and the insulating layer 203, and by absorbing X-rays incident upon the first metallic layer and transmitted therethrough in the second metallic layer, photoelectrons are emitted based on the above-described principle. It is thereby possible to improve the efficiency of utilization of X-rays and therefore to increase the sensitivity of the X-ray detector. The optimum number of laminated pairs is determined as a design item in accordance with the intensity of incident X-rays, the efficiency of injection of photoelectrons into the semiconductor layer, and the like.

Although, in FIG. 8(b), the same materials are used for the metallic layer 202 and the insulating layer 203 of the respective pairs, respectively, the materials for the metallic layer and the insulating layer may be changed for each pair in order to optimize the barrier height $\phi_b$ between the metallic layer and the insulating layer, and the band gap Eg of the insulating layer for each pair.

In the present embodiment, for the purpose of simplification, a single-unit detector is formed and evaluated. However, as will be described later, the detector may be divided into a plurality of pixel regions, or may be processed in various forms.

Fifth Embodiment

In a fifth embodiment of the present invention, an electromagnetic-wave detector is divided into a plurality of pixel regions which are two-dimensionally arranged.

Figure 9A:
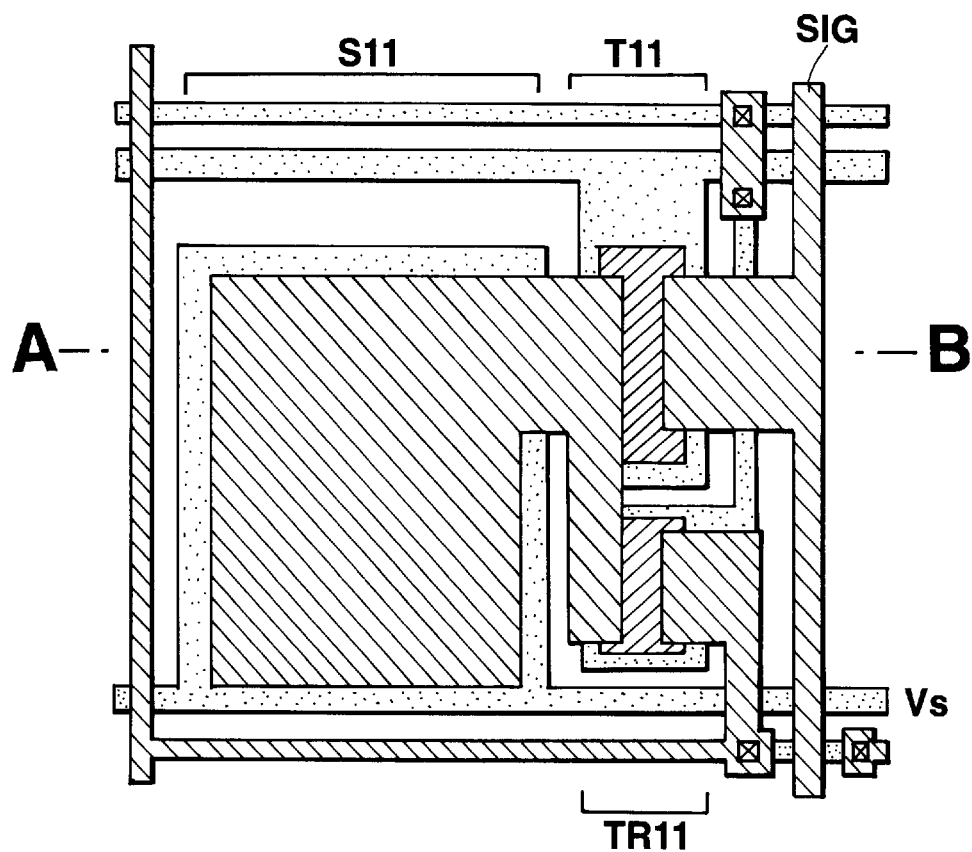
Figure 9B:
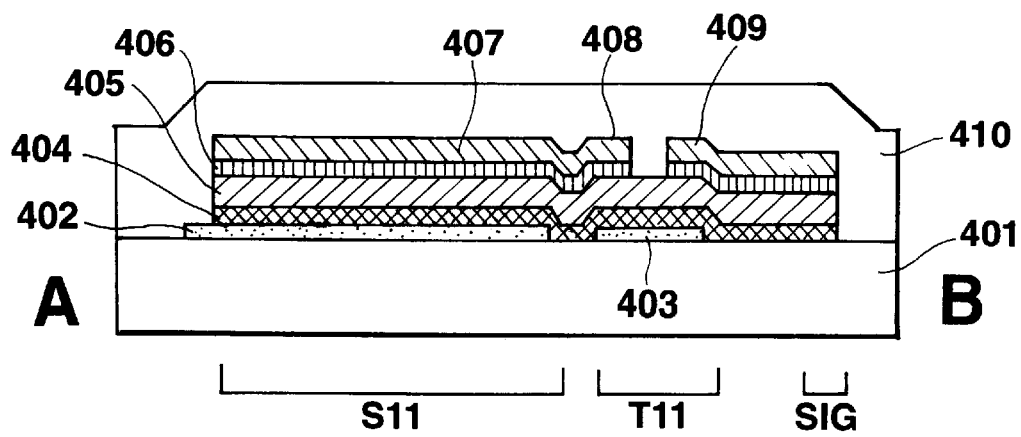

FIG. 9(a) is a schematic plan view of one pixel region of the detector of the fifth embodiment. FIG. 9(b) is a schematic cross-sectional view taken along line A–B. Each pixel region is driven by an external driving circuit via an interconnection, and signals from respective pixel regions are sequentially read out to the outside of the detector. In the fifth embodiment, the X-ray detector is divided into the respective pixel regions, each of which comprises an X-ray sensing unit using the MIS-type X-ray sensor described in the first embodiment, an interconnection, a storage capacitor, and a thin-film transistor for driving the sensor. In the fifth embodiment, each of these units has the structure of metallic layers, an insulating layer and a semiconductor layer. Hence, all of the units can be integrally formed using the same materials and the same processes. According to this feature, the production process can be simplified, and therefore a low-cost and large-area two-dimensional X-ray detector can be manufactured.

The fifth embodiment will now be described with reference to FIGS. 9(a) and 9(b).

First, a tungsten film 1 μm thick is formed on a cleaned glass substrate 401 by sputtering as a metallic layer. Since the metallic layer serves as a layer for absorbing X-rays, an element having a large atomic weight having a large X-ray absorption coefficient, such as tungsten (W), gold (Au), tantalum (Ta), lead (Pb) or the like, is selected as the material for the metallic layer. In the fifth embodiment, tungsten is used. A resist pattern having a desied shape is formed on this metallic layer, and unnecessary portions of the metallic layer are removed by etching. The resist is then removed and the surfaces of the remaining portions are cleaned to form a lower electrode 402 of the X-ray sensor, and a gate electrode 403 of a thin-film transistor.

Then, a hydrogenated amorphous silicon nitride film 500 Å thick is deposited as an insulating layer 404 by plasma CVD using $SiH_4$, $NH_3$ and $H_2$ as source gases. Since hydrogenated amorphous silicon nitride has a band gap close to 5 eV, it can form a sufficient barrier height with a metal.

Then, an i-type hydrogenated amorphous silicon layer 1000 Å thick is deposited as a semiconductor layer 405 by plasma CVD using $SiH_4$ and $H_2$ as source gases. Then, an $n^+$-type hydrogenated amorphous silicon layer 500 Å thick is deposited as an $n^+$-type semiconductor layer 406 by plasma CVD using $SiH_4$, $PH_3$ and $H_2$ as source gases. If a series of hydrogenated amorphous silicon-type materials are used, the successive layers can be easily formed using the same apparatus. Plasma CVD is very advantageous when manufacturing large-area X-ray detectors with a low cost, because a large-area uniform film can be formed.

Then, a resist contact-hole pattern having a desired shape is formed, and unnecessary portions of the insulating layer, the semiconductor layer and the $n^+$-type layer are removed by dry etching. By removing the resist and cleaning the surfaces of the remaining portions, contact holes are formed.

Then, an aluminum layer 1 μm thick is deposited by sputtering. Then, a resist pattern having a desired pattern is formed, and unnecessary portions of the aluminum layer are removed by etching. Then, the resist is removed and the surfaces of the remaining portions are cleaned to form an upper electrode 407 of the X-ray sensor, and a source electrode 408 and a drain electrode 409 of the thin-film transistor. Then, using this aluminum pattern as a mask, a channel portion of the thin-film transistor of the $n^+$-layer 406 is removed by etching. Finally, a hydrogenated amorphous silicon nitride layer 3000 Å thick is deposited as a passivation layer 410 by plasma CVD using $SiH_4$, $NH_3$ and $H_2$ as source gases.

In the present embodiment, the tungsten metallic layer 102, serving as an X-ray absorbing layer, is first formed. However, it is only necessary that the metallic layer, the insulating layer and the semiconductor layer contact each other in this sequence, a manufacturing process reverse to the above-described process, in which the aluminum metallic layer is first deposited and finally the tungsten metallic layer is deposited, is also possible.

The tunnel leak current in this structure could be suppressed to a very low value of about $10^{-13}$. As a result, an X-ray detector which can directly detect X-rays with an excellent sensitivity without requiring a phosphor could be manufactured.

The X-ray detection characteristics of each pixel region of the X-ray sensor of the present embodiment is the same as in the first embodiment. The sensor structure of the second embodiment may, of course, be adopted. In this case, however, the structure of the sensors is different from the structure of the thin-film transistors, and therefore the process becomes more or less complicated.

Figure 10:
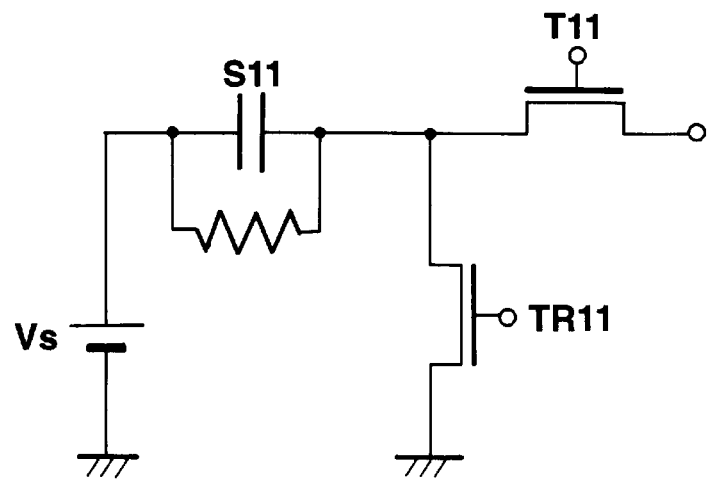
FIG. 10 is a schematic circuit diagram illustrating an equivalent circuit of the one detection unit of the electromangetic-wave detector shown in FIGS. 9(a) and 9(b)
Figure 12:
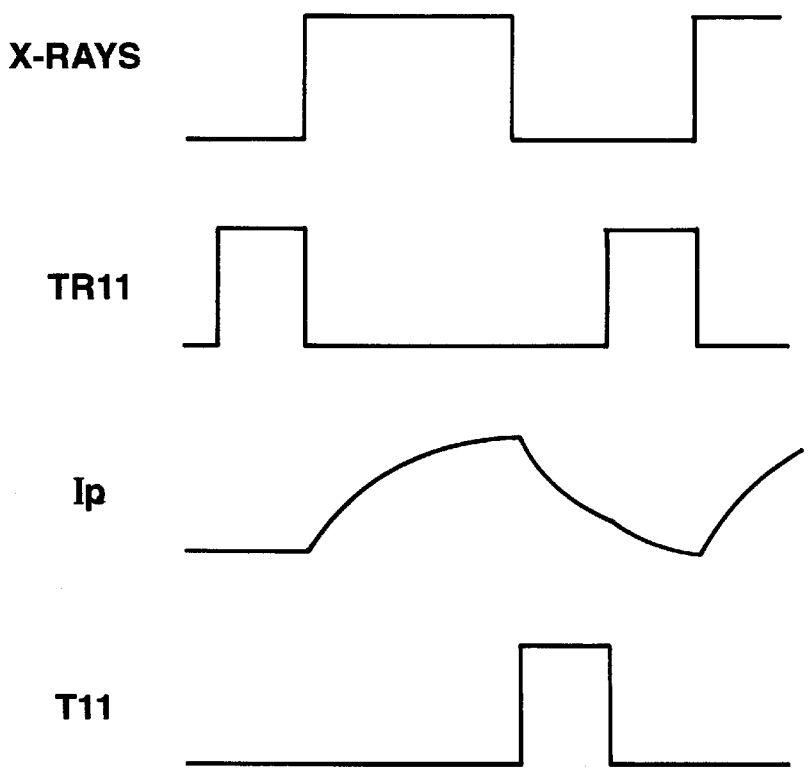
FIG. 12 is a schematic timing chart illustrating an example of drive timing.
Figure 11:
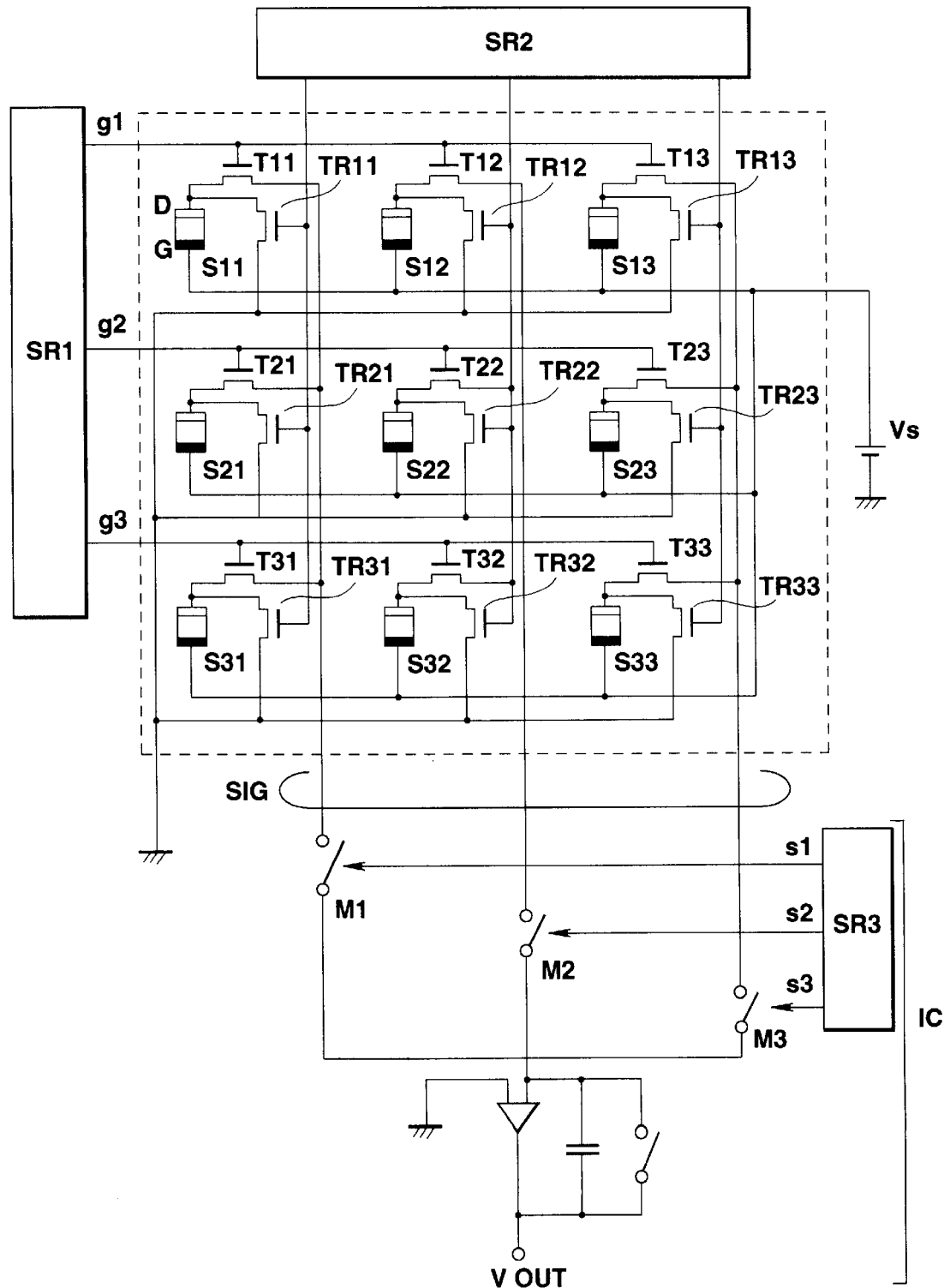
FIG. 11 is a schematic circuit diagram illustrating circuitry when the detection units are arranged in the form of a matrix.

FIG. 10 illustrates an equivalent circuit of one pixel region. FIG. 11 illustrates the entire circuitry of the fifth embodiment. FIG. 12 is a timing chart for the equivalent circuit shown in FIG. 10.

In FIG. 10, there are shown an X-ray sensor S11, a transistor T11 for signal output, a transistor TR11 for refleshing, and a voltage Vs applied to the X-ray sensor S11. As shown in FIG. 11, the pixel regions are arranged in the form of 3×3. Transistors (T11–T13, T21–T23, T31–T33) for signal output in the direction of rows of the respective pixel regions are controlled by a shift register SR1, and transistors (TR11–TR31, TR12–TR32, TR13–TR33) for refleshing in the direction of columns of the respective pixel regions are controlled by a shift register SR2. Signals output from the respective pixel regions in the direction of rows are sequentially output by being selected by switches M1 and M2 controlled by a shift register SR3.

Next, the operation of the circuit of the fifth embodiment shown in FIG. 10 will be described with reference to FIG. 12. First, a positive potential is applied to the gate electrode of the transistor TR11 to turn on the transistor TR11. Electric charges remaining in the X-ray sensor S11 are refleshed. Then, a negative potential is applied to the gate electrode of the transistor TR11 to turn off the transistor TR11. Then, the X-ray generating tube is turned on to emit X-rays for an appropriate time period. At that time, a current corresponding to the amount of the X-rays flows and is stored in the sensor which also functions as a capacitor. After the irradiation of the X-rays has been terminated, a positive potential is applied to the gate electrode of the transistor T11 to turn on the transistor T11. The stored electric charges pass through the transistor T11 and can be taken out as a signal.

By using, for example, the detector of the present embodiment as an X-ray detector for medical use, an X-ray image can be obtained in real time, and moving images can also be obtained. By performing image processing of the obtained images, various kinds of information can be obtained. Furthermore, since a detector for a conventional film cassette is provided without requiring a particular optical system, the detector can be easily used, and a small and light system can be obtained with a greatly reduced cost. Hence, inexpensive apparatuses having functions which could previously been obtained only with expensive high-grade apparatuses become easily available. Furthermore, since X-rays are directly utilized without using a phosphor, the efficiency of utilization of X-rays is improved, and even a small amount of X-rays can be detected with high sensitivity.

Sixth and Seventh Embodiments

A description will now be provided of sixth and seventh embodiments of the present invention with reference to FIGS. 13(a) and 13(b), respectively. FIGS. 13(a) and 13(b) illustrate the configurations of typical thin-film-transistor-type devices.

Each of these embodiments provides a single-unit X-ray detector having the configuration that the gate electrode of a TFT-type sensor is utilized as an X-ray absorbing material, and that electric charges injected from the gate electrode in accordance with the intensity of X-rays are taken out as a current between the source electrode and the drain electrode.

FIG. 13(a) illustrates an inverse-stagger-type device, and FIG. 13(b) illustrates a coplanar-type device. In FIGS. 13(a) and 13(b), X-rays are irradiated from the substrate side and from a side opposite to the substrate, respectively. In FIG.

13(a), in order to reduce absorption of X-rays by the substrate, it is preferable to use a resin substrate, a glass substrate or the like having a small X-ray absorption coefficient. In the device of the six embodiment shown in FIG. 13(a), a glass substrate 0.5 mm thick is used. FIG. 13(b) is a suitable configuration from the viewpoint of capable of freely selecting a material for the substrate. In the device of the seventh embodiment shown in FIG. 13(b), a glass substrate 1 mm thick is used.

In FIGS. 13(a) and 13(b), a metallic layer 1302 performs photoelectric conversion by absorbing X-rays, and also functions as the gate electrode. In the sixth and seventh embodiments, tungsten is used for the metallic layer 1302. A metal layer made of gold (Au), tantalum (Ta), lead (Pb) or the like having a large X-ray absorption coefficient may also be used instead of tungsten. Furthermore, an alloy of two or more of these elements may also be used.

There are also shown an insulating layer 1303 using hydrogenated amorphous silicon nitride, a semiconductor layer 1304 using hydrogenated amorphous silicon, an $n^+$-type hydrogenated amorphous silicon layer 1305, a source electrode 1306 using aluminum for taking out signals, and a drain electrode 1307.

The method for manufacturing the devices shown in FIGS. 13(a) and 13(b) is basically the same as the method for manufacturing the MIS-type sensor of the first embodiment. In each of the sixth and seventh embodiments, however, in order to utilize the second electrode layer as electrodes for taking out a signal from the TFT-type sensor, the source electrode and the drain electrode are formed.

Although in FIGS. 13(a) and 13(b) the manufacturing sequence of the respective layers is inversed at some porions, the basic manufacturing method is the same as in the foregoing embodiments.

FIG. 14 is an energy-band diagram in these embodiments.

In FIG. 14, the value of $\phi_b$ (the barrier height between the metal and the hydrogenated amorphous silicon nitride) is 2.5 eV under the conditions of these embodiments.

In order to evaluate the characteristics of each of the above-described single-unit X-ray detectors, a Coolidge tube having a tungsten target was used as an X-ray generating tube. The tube voltage was 140 kV. The tube current was changed as 2 mA, 20 mA and 200 mA, and the dose rate of X-ray irradiation (illuminance) was changed as 1, 10 and 100 (an arbitrary unit). Continuous X-rays and the characteristic X-rays of tungsten were utilized. By making the tube voltage constant, the shortest wavelength of the continuous X-rays is constant.

When detecting X-rays, a voltage Vg was applied to the tungsten gate electrode, a voltage Vd of 12 V was applied to the drain electrode, and the source electrode was grounded.

FIG. 15 illustrates X-ray detection characteristics in these embodiments. In FIG. 15, the abscissa represents the gate voltage, and the ordinate represents the drain current Id. It can be understood from FIG. 15 that the drain current at each gate voltage changes as the illuminance of X-rays changes (by one digit as 1, 10 and 100 in arbitrary unit (A.U.)).

FIG. 16 illustrates the dependency of the drain current Id on the illuminance of X-rays when Vg=-2 V. The gamma ($\gamma$) is substantially 1, so that the linearity of the output for the illuminance is sufficiently obtained.

As a result, in each of the sixth and seventh embodiments, an X-ray detector which directly detects X-rays with an excellent sensitivity without requiring a phosphor could be obtained.

In each of the sixth and seventh embodiments, for the purpose of simplification, a single-unit detector is formed and evaluated. However, as described in detail in the fifth embodiment, the detector may be divided into a plurality of pixel regions, or the detector may be processed in various forms.

In each of the sixth and seventh embodiments, also, by designing the thickness of the metallic layer to an optimum value and laminating a plurality of pairs of the metallic layer and the insulating layer, the efficiency of utilization of X-rays is improved, and the efficiency of injection of carriers into the semiconductor is also improved.

As described above, by providing at least a pair of electrodes in ohmic contact with the semiconductor layer at a side of the semiconductor layer where a pair of the metallic layer and the insulating layer is provided, or at the opposite side of the semiconductor layer, an optimum design is easily performed.

As described above, according to the present invention, moving images which cannot be obtained by using a silver-halide film can be obtained in real time with high sensitivity, and the obtained images can be further utilized by being subjected to image processing.

Furthermore, it becomes possible to provide a low-cost compact system which does not require a particular reduction optical system and which has a detector that can be easily used by simply replacing a conventional detector for a film cassette. Moreover, it becomes also possible to manufacture inexpensive X-ray detection apparatuses having functions which could previously been obtained only with expensive high-grade apparatuses, and to utilize the apparatuses for various applicational fields.

The individual components shown in outline in the drawings are all well known in the electromagnetic-wave detector arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An electromagnetic-wave detector comprising:
   an X-ray detection unit which comprises a plurality of X-ray detection elements and on which said plurality of X-ray detection elements are arranged two-dimensionally in the form of a matrix, said plurality of X-ray detection elements further comprising:
      M (M$\geq$1) consecutive pairs of a metallic layer comprising a metal selected from the group of tungsten, gold, tantalum and lead, for absorbing the incident X-rays, and an insulating layer connected to the metallic layer and provided at a side opposite to the side of incidence of X-rays, and
      a semiconductor layer at the side of said insulating layer,
   wherein a barrier height is formed between said metallic layer and said insulating layer, said barrier height being exceeded by an electron which is excited by incident X-rays on said metallic layer and not being exceeded by an electron which is excited by light having a wavelength longer than those of X-rays.

2. A detector according to claim 1, wherein said insulating layer comprises an amorphous material comprising silicon as a host material including atoms of at least one element selected from the group consisting of nitrogen, carbon and oxygen.

3. A detector according to claim 2, wherein said amorphous material comprises at least one selected from the group consisting of a hydrogenated and/or halogenated amorphous silicon nitride film, a hydrogenated and/or halogenated amorphous silicon carbide film, and a hydrogenated and/or halogenated amorphous silicon oxide film.

4. A detector according to claim 1, wherein said insulating layer comprises a silicon oxide film or a metal oxide film.

5. A detector according to claim 1, wherein said semiconductor layer comprises a noncrystalline semiconductor layer.

6. A detector according to claim 5, wherein said noncrystalline semiconductor layer comprises amorphous silicon.

7. A detector according to claim 1, wherein said semiconductor layer comprises an i-type semiconductor layer.

8. A detector according to claim 1, wherein said semiconductor layer contacts an $n^+$-type layer at a side opposite to said insulating layer.

9. A detector according to claim 1, wherein said semiconductor layer is in ohmic contact with an electrode at a side opposite to said insulating layer.

10. A detector according to claim 1, wherein said semiconductor layer comprises an i-type-layer region and an n-type-layer region.

11. A detector according to claim 1, wherein said semiconductor layer comprises a p-type-layer region, an i-type-layer region and an n-type-layer region sequentially provided from said insulating layer.

12. A detector according to claim 1, wherein the number M of pairs of said metallic layer and said insulating layer is equal to or greater than 2, and wherein said metallic layers and said insulating layers of the respective pairs are made of the same materials, respectively.

13. A detector according to claim 1, further comprising a pair of electrodes in ohmic contact with said semiconductor layer.

14. A detector according to claim 1, further comprising at least one pair of electrodes in ohmic contact with said semiconductor layer at the side where the pairs of said metallic layer and said insulating layer are provided.

15. A detector according to claim 1, further comprising at least one pair of electrodes in ohmic contact with said semiconductor layer at a side opposite to the side where the pairs of said metallic layer and said insulating layer are provided.

16. A detector according to claim 5, wherein said noncrystalline semiconductor includes silicon atoms.

17. A detector according to claim 6, wherein said amorphous silicon comprises hydrogenated amorphous silicon.

18. A detector according to claim 1, wherein said insulating layer has a thickness of at least 500 Å.

19. A detector according to claim 1, wherein pixel regions, each comprising a detection unit and a driving unit, are arranged one-dimensionally or two-dimensionally on the same substrate.

20. A detector according to claim 1, wherein said metallic layer has the same material as a target material of an X-ray generating tube for generating X-rays.

21. An electromagnetic-wave detector according to claim 1, wherein a barrier height between said metallic layer and said insulating layer is 2 eV or greater.

22. An electromagnetic-wave detector according to claim 21, wherein the barrier height is 3 eV or lower.

23. An electromagnetic-wave detector according to claim 1, wherein said insulating layer transmits substantially zero tunnel current.

* * * * *